US006677764B1

(12) United States Patent
Bachman

(10) Patent No.: US 6,677,764 B1
(45) Date of Patent: Jan. 13, 2004

(54) SYSTEM FOR PROTECTING ELECTRONIC TEST EQUIPMENT FROM CHARGED CAPACITORS

(76) Inventor: John G. Bachman, 100 Merrimack Rd., Amherst, NH (US) 03031

( * ) Notice: Subject to any disclaimer, the term of this patent is extended or adjusted under 35 U.S.C. 154(b) by 0 days.

(21) Appl. No.: 10/128,912

(22) Filed: Apr. 23, 2002

Related U.S. Application Data
(60) Provisional application No. 60/285,729, filed on Apr. 23, 2001.

(51) Int. Cl.[7] .............................................. G01R 27/26
(52) U.S. Cl. ........................ 324/658; 324/548; 361/118
(58) Field of Search ............................. 361/118, 15, 82, 361/84, 35; 324/548, 658, 676, 678, 684, 710, 713, 719, 720, 725

(56) References Cited

U.S. PATENT DOCUMENTS

| | | | |
|---|---|---|---|
| 4,216,424 A | 8/1980 | Vette | 324/659 |
| 4,434,401 A * | 2/1984 | York | 324/766 |
| 4,795,966 A | 1/1989 | Cook | 324/659 |
| 4,825,147 A | 4/1989 | Cook et al. | 324/678 |
| 6,054,864 A | 4/2000 | Butts | 324/548 |
| 6,198,290 B1 | 3/2001 | Krinker | 324/548 |

* cited by examiner

*Primary Examiner*—N. Le
*Assistant Examiner*—Vincent Q. Nguyen
(74) *Attorney, Agent, or Firm*—Maine & Asmus

(57) ABSTRACT

A system for protecting test equipment intended to perform in-circuit or other low level testing and may connect to a charged capacitor. In one embodimnet, a transformer with three windings is used to couple the ESR meter to the capacitor being tested in a manner that protects the ESR meter. In operation, the ESR meter is connected to the primary winding and the capacitor to be measured is connected to one of the secondary windings. The other secondary winding is connected to the first secondary winding through two diodes that are not conducting during the measurement but do conduct if the capacitor being measured has an electrical charge. The transformer secondary windings are connected to each other so the capacitor discharging currents create flux in the transformer core that are of the same magnitude and opposite polarity, thereby canceling their effect on the primary winding.

7 Claims, 3 Drawing Sheets

SYSTEM FOR PROTECTING ELECTRONIC TEST EQUIPMENT FROM CHARGED CAPACITORS

CROSS REFERENCE TO RELATED APPLICATIONS

This application claims priority under 35 U.S.C. Section 119 from a U.S. Provisional Patent Application serial No. 60/285,729 filed on Apr. 23, 2001, which is incorporated herein by reference for all purposes.

BACKGROUND OF THE INVENTION

1. Technical Field of the Invention

The present invention is in the field of automatic protective devices and pertains in particular to protection of electronic test equipment that performs low level measurement of the characteristics of electronic capacitors.

2. Background Art

In many areas of electronics it is necessary to measure the characteristics of passive electronic components. The ability to accurately pinpoint faulty or defective components has enormous economic value both for production line assembly and repair. Test equipment for measuring and testing of capacitors includes impedance measuring instruments, equivalent series resistance (ESR) meters, and capacitance meters.

However the testing of capacitors is problematic as compared to the testing of resistors. When testing capacitors, if the capacitor being measured is holding an electrical charge, the measuring instrument, other components or the capacitor itself may be damaged. In addition, there is the increased safety risk to personnel whenever dealing with charged capacitors that are not properly handled.

Personnel using such instruments must be sure to safely and completely discharge electronic capacitors before attempting a measurement of the capacitor's characteristics. The discharging process can be time-consuming, hazardous to personnel, equipment and the meter and equipment. And, the discharge may also be incomplete. If personnel skip the discharge process or fail to complete the full discharge process, the capacitor can retain an electrical charge that can damage the measuring instrument and the capacitor itself when testing.

Some instruments such as the CapAnalyzer 88A employ a relay to first discharge the capacitor under test. Such arrangements are limited to the current carrying capacity of the relay contacts and the safe discharge current capability of the capacitor under test. The additional components add to the cost and size of the equipment. Testing of capacitors that exceed the discharge path limits the effectiveness of the tester. Finally, employing such a discharge process adds to the time required to perform the testing.

There have been several attempts in the prior art to address the aforementioned problems. A method and apparatus for testing electrolytic capacitors is described in U.S. Pat. No. 4,216,424 ('424). The '424 reference discloses an Equivalent Series Resistance (ESR) measurement device for testing electrolytic capacitors in-circuit and includes a method of protection from damage due to charged capacitors. However, the '424 method does not provide full protection from damage, since a large test capacitor with a large charge can still damage meters and equipment.

In U.S. Pat. No. 6,198,290 a method to detect defective capacitors is disclosed, wherein there is a method for measuring the value of capacitors in-circuit, but there is no protection against charged capacitors.

There is an in-circuit capacitor checker set forth in U.S. Pat. No. 6,054,864, wherein the capacitor test apparatus measures the value of capacitors in-circuit, and includes a user-operated switch for discharging the capacitors being tested.

Two related patents, U.S. Pat. No. 4,825,147 and U.S. Pat. No. 4,795,966, disclose an instrument and method for measuring the equivalent series resistance of a capacitor. The disclosed design offers little protection, and the device can be damaged by charged capacitors.

Many electronic measuring instruments, such as ESR meters, determine the characteristics of a capacitor by applying low-level alternating current or pulse signals to the capacitor under test. Low levels are used to permit "in-circuit" testing. If the test signal amplitude is below the threshold of semiconductor devices then those devices are not affected and the capacitor characteristics can be measured as if it were the only component in the circuit. The low level test signal must be passed unimpeded by the discharging/protecting device. The harmful charge on the capacitor under test is a direct current signal and must be discharged while minimizing the effects of that discharge on the measuring instrument and the capacitor under test.

What is needed is a device that permits the measuring instrument to accurately perform its function while automatically discharging capacitors under test in a manner that does not pass the charge to the measuring instrument, does not damage the capacitor under test and does so without unnecessary delay.

SUMMARY OF THE INVENTION

The invention is devised in the light of the problems of the prior art described herein. Accordingly it is a general object of the present invention to provide a novel and useful technique that can solve the problems described herein.

In an embodiment of the present invention, a system is provided for permitting electronic measurement equipment to accurately measure the alternating current and pulse characteristics of capacitors regardless of pre-existing charges on the capacitor under test.

In one embodiment, the measuring instrument is connected to the primary coil of a transformer having winding ratios of 1:1:1. The secondary windings of the transformer are connected to each other in opposing polarity through two diodes connected "back to back", and the capacitor under test is connected across the secondary windings. Since the measuring instrument produces low level alternating current signals, the diodes are not conducting, so that the instrument is simply coupled to the capacitor under test through the transformer. This permits normal operation of the instrument.

If the capacitor under test has an electrical charge, the charge will cause one of the diodes to become conducting, and discharging current flows through both secondary windings of the transformer. These currents are nearly equal to each other so that the resulting flux in the transformer core will be nearly zero resulting in minimal coupling of the charge to the primary coil.

Once the capacitor under test is discharged sufficiently, the diode stops conducting and the remaining charge is dissipated through the single secondary winding. After the charge on the capacitor under test is completely removed the measuring instrument completes the measurement.

Another embodiment adds a separate discharging circuit to minimize the amount of discharging current that flows through the transformer windings. A low value blocking capacitor in series with the transformer secondary windings minimizes the current flow while a shunt resistor discharges the capacitor under test.

A further embodiment adds a pair of "back to back" diodes to the discharge shunt resistor. The purpose of these diodes is to decouple the measuring signal from the shunt resistor. Many ESR meters use low level signals to perform the measurement function, but are also able to measure high values of ESR. In such cases, the presence of the discharging shunt resistor could create a measurement error, and adding the decoupling diodes eliminates such error.

An object of the invention is an electronic apparatus for measuring performance of a capacitor under test using an Equivalent Series Resistance (ESR) meter, comprising a transformer having a primary winding coupled to the ESR meter and a pair of secondary windings coupled to the capacitor under test. There are a pair of opposing diodes in parallel and coupled to the pair of secondary windings in opposing polarity through the pair of diodes.

A further object is the electronic apparatus, wherein the apparatus is an external device coupling to the ESR meter on a first connector and coupling to the capacitor on a second connector. Alternatively, the apparatus is integrated within said ESR meter.

An additional object is the electronic apparatus, wherein the transformer has a winding ratio of 1:1:1. The device can also use a low value blocking capacitor in series with the secondary windings. The device can also have a first shunt resistance coupled in parallel to the capacitor under test. In addition, there can be a second shunt resistance coupled in series to the first shunt resistance, and an opposing pair of shunt diodes coupled parallel to the second shunt resistance.

Still other objects and advantages of the present invention will become readily apparent to those skilled in this art from the following detailed description, wherein I have shown and described only a preferred embodiment of the invention, simply by way of illustration of the best mode contemplated by me on carrying out the invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF THE PREFERRED EMBODIMENT

Figure 1:
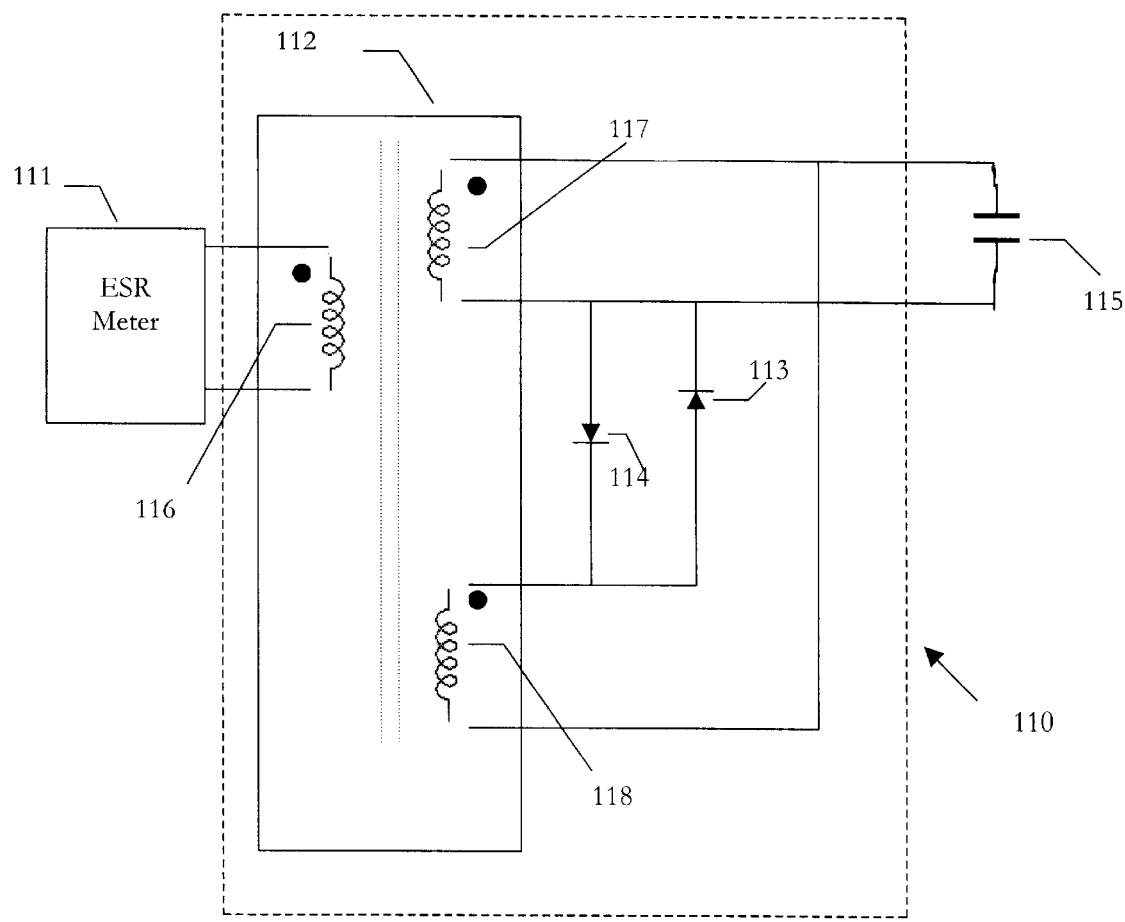
FIG. 1 is a schematic circuit diagram of an instrument for permitting an ESR meter to measure the ESR of a charged capacitor without the charge being transferred to the ESR meter.

Referring to FIG. 1, there is shown a schematic circuit diagram of the 'instrument' 110 that is connected between an ESR meter 111 and a capacitor being tested 115. The low-level current pulses generated by the ESR meter 111 are passed through transformer 112 to the capacitor being tested 115. Since these current pulses are low-level, diodes 113 and 114 are not conducting. If the capacitor being tested 115 is holding a charge then one of the diodes 113 or 114 will become conducting. The diode 113, 114 that conducts depends upon the polarity of the charge on the capacitor being tested 115.

The secondary windings 117, 118 of transformer 112 are thus connected to each other through the conducting diode 113 or 114 so that discharge current flows in both secondary windings 117, 118 of transformer 112. The current flow path in the secondary windings 117, 118 is such that the resulting core flux cancels so that very little of discharge current is transferred to the primary 116 of transformer 112. Thus the ESR meter is able to accurately measure the ESR of the capacitor under test 115 but is protected from any charge held therein.

While the circuit 110 is shown as a separate instrument that couples to the ESR meter 111, and has a suitable connector to the capacitor 115. It is also within the scope of the invention to have the present scheme incorporated within the ESR meter.

OTHER EMBODIMENTS OF THE INVENTION

Figure 2:
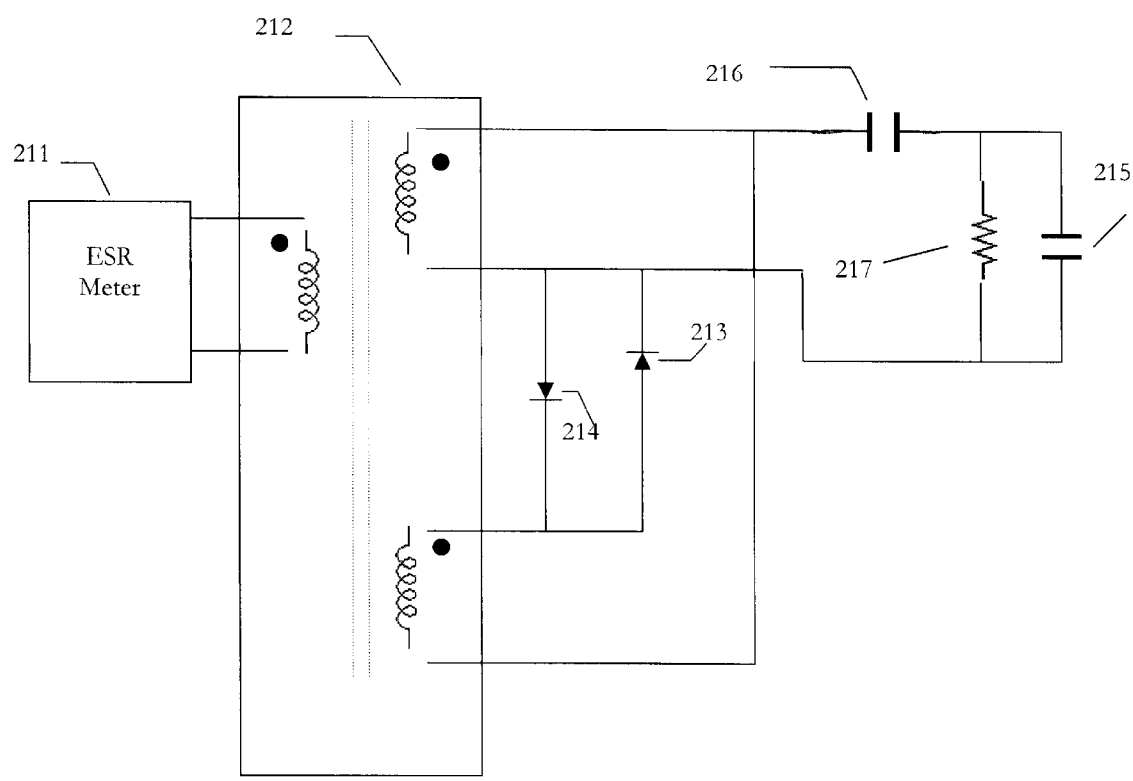
FIG. 2 is a schematic circuit diagram that adds a blocking capacitor and discharging resistor to the instrument described in FIG. 1.

Referring to FIG. 2, there is shown a schematic circuit diagram of an instrument that is connected between an ESR meter 211 and a capacitor being tested 215. The low-level current pulses or ac signals generated by the ESR meter 211 are passed through transformer 212 and blocking capacitor 216 to the capacitor being tested 215.

Since these test signals are low-level, diodes 213 and 214 are not conducting. If the capacitor being tested 215 is holding a charge, then part of that charge is transferred to blocking capacitor 216. This discharge of the capacitor results in a current that causes one of the diodes 213 or 214 to conduct for a period of time determined by the value of the blocking capacitor, the dc resistance of the transformer windings, the leakage inductance of transformer windings and other circuit values. Which diode conducts depends upon the polarity of the charge on the capacitor being tested 215. The secondary windings of transformer 212 are thus connected to each other through the conducting diode 213 or 214 so that discharge current flows in both secondary windings of transformer 212. The current flow path in the secondary windings of transformer 212 is such that the resulting core flux cancels so that very little of discharge current is transferred to the primary of transformer 212. Thus the ESR meter is able to accurately measure the ESR of the capacitor under test 215 but is protected from the charge held on it.

The value of blocking capacitor 216 should be selected to minimize the amount of the discharge current that flows through the conducting diode. The remaining charge on the capacitor under test 215 is discharged through shunt resistor 217. The value and power dissipation capability of the shunt resistor 217 should be selected to assure that it does not fail under specified operation ranges.

In an embodiment designed specifically for use with the Capacitor Wizard ESR meter manufactured by Independence Electronics, the values of the blocking capacitor and the transformer leakage inductance are selected for resonance at the operating frequency of the Capacitor Wizard (100 Khz) (100 KHz). In this embodiment the reactive components of the circuitry would result in false readings by the Capacitor Wizard when measuring small value capacitors (less than 10 microfarads). Resonance at the operating frequency eliminates this error.

The use of the prior art methods with the Capacitor Wizard results in unacceptable errors that occur when measuring the ESR of capacitors with values below 10 microfarads. In fact, some capacitors would result in negative values being indicated by Capacitor Wizard. These errors are eliminated by the present invention.

Figure 3:
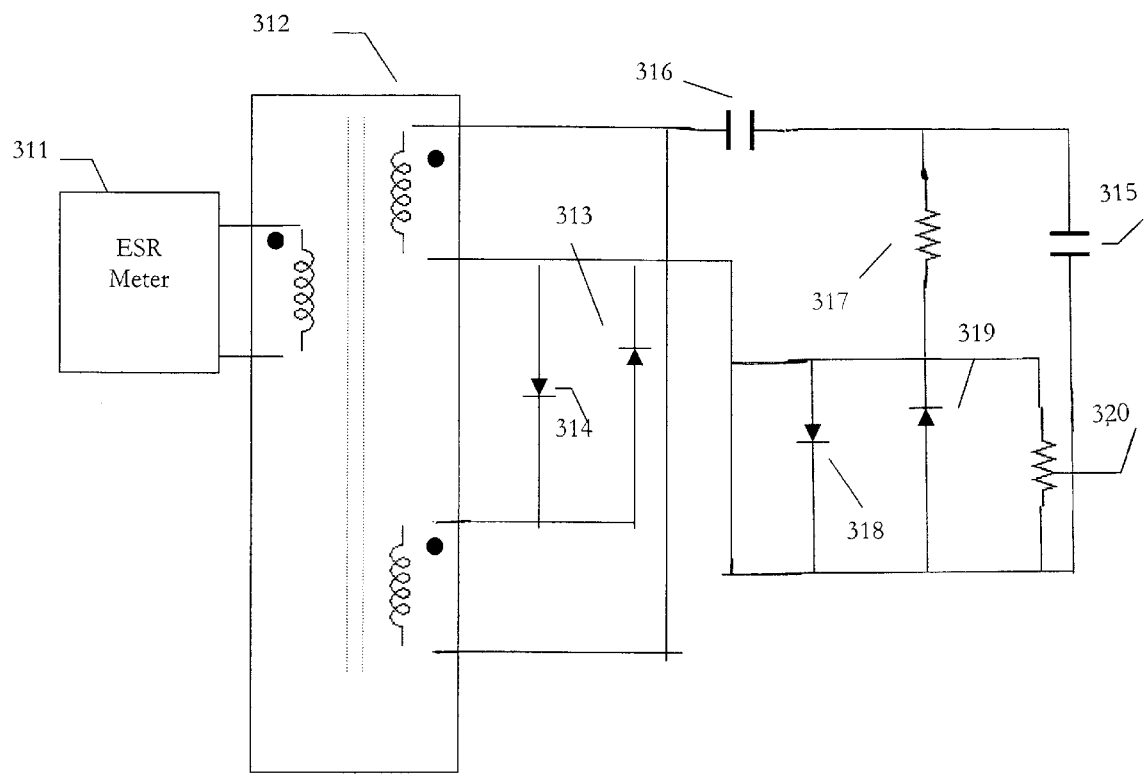
FIG. 3 is a schematic circuit diagram that adds a pair of decoupling diodes to the instrument described in FIG. 2.

Referring to FIG. 3, there is shown a schematic circuit diagram of an instrument that is connected between an ESR meter 311 and a capacitor being tested 315. Some ESR meters are able to measure not only the very low values of ESR found in some capacitors but also higher levels of resistance. In this embodiment the low-level current pulses generated by the ESR meter 311 are passed through transformer 312 and blocking capacitor 316 to the capacitor being tested 315. Since these current pulses are low-level, diodes 313, 314, 318 and 319 are not conducting. If the capacitor being tested 315 is holding a charge then part of that charge will be transferred to blocking capacitor 316 resulting in a current that causes one of the diodes 313 or 314 to conduct. Which diode conducts depends upon the polarity of the charge on the capacitor being tested 315. The secondary windings of transformer 312 are thus connected to each other through the conducting diode 313 or 314 so that discharge current flows in both secondary windings of transformer 312. The current flow path in the secondary windings of transformer 312 is such that the resulting core flux cancels so that very little of discharge current is transferred to the primary of transformer 312. Thus the ESR meter is able to accurately measure the ESR of the capacitor under test 315 but is protected from the charge held on it.

The value of blocking capacitor 316 should be selected to minimize the amount of the discharge current that flows through the conducting diode 313 or 314. The remaining charge on the capacitor under test 315 causes one of the diodes 318 or 319 to conduct so that the capacitor under test 315 is discharged through shunt resistor 317. Which diode 318 or 319 conducts depends upon the polarity of the charge on capacitor under test 315. Additional shunt resistor 320 provides final discharge path for capacitor under test 315 and blocking capacitor 316 when the charge is too low to cause diodes 318 or 319 to conduct.

Numerous characteristics and advantages have been set forth in the foregoing description, together with details of structures and functions of critical race control, and the novel features thereof are pointed out in appended claims. The disclosure, however, is illustrative only, and changes may be made in arrangement and details, within the principle of the invention, to the full extent indicated by the broad general meaning of the terms in which the appended claims are expressed.

The objects and advantages of the invention may be further realized and attained by means of the instrumentalities and combinations particularly pointed out in the appended claims. Accordingly, the drawing and description are to be regarded as illustrative in nature, and not as restrictive.

What is claimed is:

1. An electronic apparatus for measuring performance of a capacitor under test using an Equivalent Series Resistance (ESR) meter, comprising:

a transformer having a primary winding coupled to said ESR meter and a pair of secondary windings including a first winding and a second winding series connected through a pair of parallel opposing polarity diodes, wherein the first winding connected across the capacitor under test and the second winding coupled to the capacitor under test form a discharge path.

2. The electronic apparatus according to claim 1, wherein said apparatus is an external device coupling to said ESR meter on a first connector and coupling to said capacitor on a second connector.

3. The electronic apparatus according to claim 1, wherein said apparatus is integrated within said ESR meter.

4. The electronic apparatus according to claim 1, wherein said transformer has a winding ratio of 1:1:1.

5. The electronic apparatus according to claim 1, further comprising a low value blocking capacitor in series with said secondary windings.

6. The electronic apparatus according to claim 1, further comprising a first shunt resistance coupled in parallel to said capacitor under test.

7. The electronic apparatus according to claim 6, further comprising a second shunt resistance coupled in series to said first shunt resistance, and an opposing pair of shunt diodes coupled parallel to said second shunt resistance.

* * * * *